US012757515B2

(12) United States Patent
Huang et al.

(10) Patent No.: US 12,757,515 B2
(45) Date of Patent: Oct. 6, 2026

(54) IMAGE SENSOR PACKAGE WITH STRAY LIGHT DIRECTING MICROSTRUCTURE COMPONENT

(71) Applicant: PIXART IMAGING INC., Hsin-Chu County (TW)

(72) Inventors: Yong-Nong Huang, Hsin-Chu County (TW); Cheng-Lin Yang, Hsin-Chu County (TW); Hui-Hsuan Chen, Hsin-Chu County (TW); Hsin-Hsiang Lo, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 370 days.

(21) Appl. No.: 18/605,828

(22) Filed: Mar. 15, 2024

(65) Prior Publication Data

US 2025/0294911 A1 Sep. 18, 2025

(51) Int. Cl.

| | |
|---|---|
| ***H10F 77/50*** | (2025.01) |
| ***H10F 55/255*** | (2025.01) |
| ***H10F 77/40*** | (2025.01) |

(52) U.S. Cl.
CPC ......... *H10F 55/255* (2025.01); *H10F 77/407* (2025.01); *H10F 77/50* (2025.01)

(58) Field of Classification Search
CPC ....... H10F 55/255; H10F 77/407; H10F 77/50
See application file for complete search history.

(56) References Cited

U.S. PATENT DOCUMENTS

2013/0334445 A1* 12/2013 Tharumalingam ... H10F 39/107 438/66
2018/0246209 A1 8/2018 Townsend
2022/0276343 A1* 9/2022 Bouchene ............ G01S 7/4811

* cited by examiner

*Primary Examiner* — Hoai V Pham
(74) *Attorney, Agent, or Firm* — Hauptman Ham, LLP

(57) ABSTRACT

There is provided an image sensor package including a substrate, a light source, a light sensor, a cover and a microstructure component. The light source and the light sensor are arranged on the substrate. The cover covers upon the substrate and has accommodation space for accommodating the light source and the light sensor. An upper surface of the cover has a recess. The microstructure component is arranged inside the recess to direct stray light toward a direction far from the light sensor.

19 Claims, 9 Drawing Sheets

IMAGE SENSOR PACKAGE WITH STRAY LIGHT DIRECTING MICROSTRUCTURE COMPONENT

FIELD OF THE DISCLOSURE

This disclosure generally relates to an image sensor package and, more particularly, to arranging a microstructure component on an upper surface of a package body of an image sensor package to redirect stray light toward a direction far from a light sensor.

BACKGROUND OF THE DISCLOSURE

Please refer to FIG. 1, it is a cross sectional view of a conventional image sensor package 100. The image sensor package 100 includes a light source 11 for illuminating an object in front of the image sensor package 100 via a first opening, and a light sensor 13 for receiving reflected light from the object via a second opening. A processor (now shown) identifies existence of the object and a distance thereof according to light signals detected by the light sensor 13.

Generally, to prevent dust from entering a light path of the image sensor package 100, a protecting glass 15 is arranged on a surface of the image sensor package 100. As shown in FIG. 1, a part of light beams generated by the light source 11 forms inner reflection inside the protecting glass 15 and propagates to the light sensor 13 to generate noises in the detected light signals.

Conventionally, a soft rubber layer can further be arranged between the image sensor package 100 and the protecting glass 15 to allow the protecting glass 15 to be attached to the rubber layer tightly so as to reduce reflected light energy.

However, because the rubber layer is made of soft material, a part of the rubber layer at the openings deforms to block the light path when the protecting glass 15 is put thereon. Meanwhile, the rubber layer increases a total thickness of the device.

The information disclosed in this BACKGROUND is merely intended to increase understanding of the general background of the invention and should not be taken as an admission or in any way implied that the relevant information constitutes prior art that is already known to a person of ordinary skill in the art.

SUMMARY

Accordingly, the present disclosure provides an image sensor package in which a recess is arranged on an upper cover for accommodating a microstructure component therein. The protecting glass attached to the image sensor package may be different when the image sensor package is applied to different products. It is possible to replace only the microstructure component adapted to different protecting glasses without manufacturing a new image sensor package so as to simplify the design procedure and reduce the manufacturing cost.

The present disclosure provides an image sensor package including an upper cover on which a recess is arranged for accommodating a microstructure component therein. The microstructure component includes multiple elongated prisms, a glass bead reflector or a cube corner reflector.

The present disclosure further provides an image sensor package that is not required to further arrange a soft rubber layer between an upper cover and a protecting film such that a total thickness is decreased.

The present disclosure provides an image sensor package including a substrate, a light sensor, a light source, a cover and a microstructure component. The light sensor is arranged on the substrate. The light source is arranged on the substrate and located at a side of the light sensor in a first direction. The cover is arranged on the substrate and covers the light sensor and the light source, wherein the cover includes a first opening opposite to the light source, a second opening opposite to the light sensor, and a recess located at an upper surface of the cover and between the first opening and the second opening. The microstructure component is arranged inside the recess.

The present disclosure further provides an image sensor package including a substrate, a light sensor, a light source, a cover and a microstructure component. The light sensor is arranged on the substrate. The light source is arranged on the substrate and located at a side of the light sensor in a first direction. The over is arranged on the substrate and covers the light sensor and the light source, wherein the cover includes a first opening opposite to the light source, a second opening opposite to the light sensor, and a recess located at an upper surface of the cover and between the first opening and the second opening. The microstructure component is arranged inside the recess, wherein a bottom surface of the microstructure component is a zig-zag surface and a top surface of the microstructure component is a plane surface, which is used to be attached to a protecting film putting on the upper surface of the cover.

The present disclosure further provides an image sensor package including a substrate, a light sensor, a light source, a cover and a microstructure component. The light sensor is arranged on the substrate. The light source is arranged on the substrate and located a side of the light sensor in a first direction. The cover is arranged on the substrate and covers the light sensor and the light source, wherein the cover includes a first opening opposite to the light source, a second opening opposite to the light sensor, and a plane upper surface. The microstructure component is attached to the plane upper surface between the first opening and the second opening.

BRIEF DESCRIPTION OF DRAWINGS

Other objects, advantages, and novel features of the present disclosure will become more apparent from the following detailed description when taken in conjunction with the accompanying drawings.

DETAILED DESCRIPTION OF THE DISCLOSURE

It should be noted that, wherever possible, the same reference numbers will be used throughout the drawings to refer to the same or like parts.

One objective of the present disclosure is to provide an image sensor package that adopts a microstructure component to redirect stray light toward a direction far from a light sensor to reduce the stray light noise degrading the performance of the light sensor. The microstructure component of the present disclosure is directly manufactured on an upper surface of a cover of the image sensor package, is attached to the upper surface of the cover of the image sensor package, or is arranged inside a recess on the upper surface of the cover of the image sensor package to realize the above objective.

Figure 1:
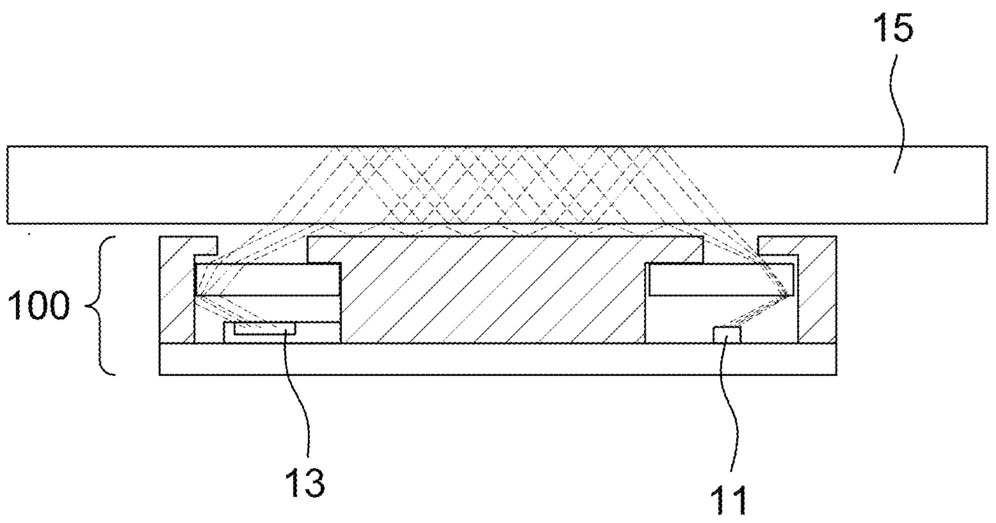
FIG. 1 (Prior Art)
FIG. 1 is a cross sectional view of the inner reflection of stray light in a protecting glass of a conventional image sensor package.
Figure 2:
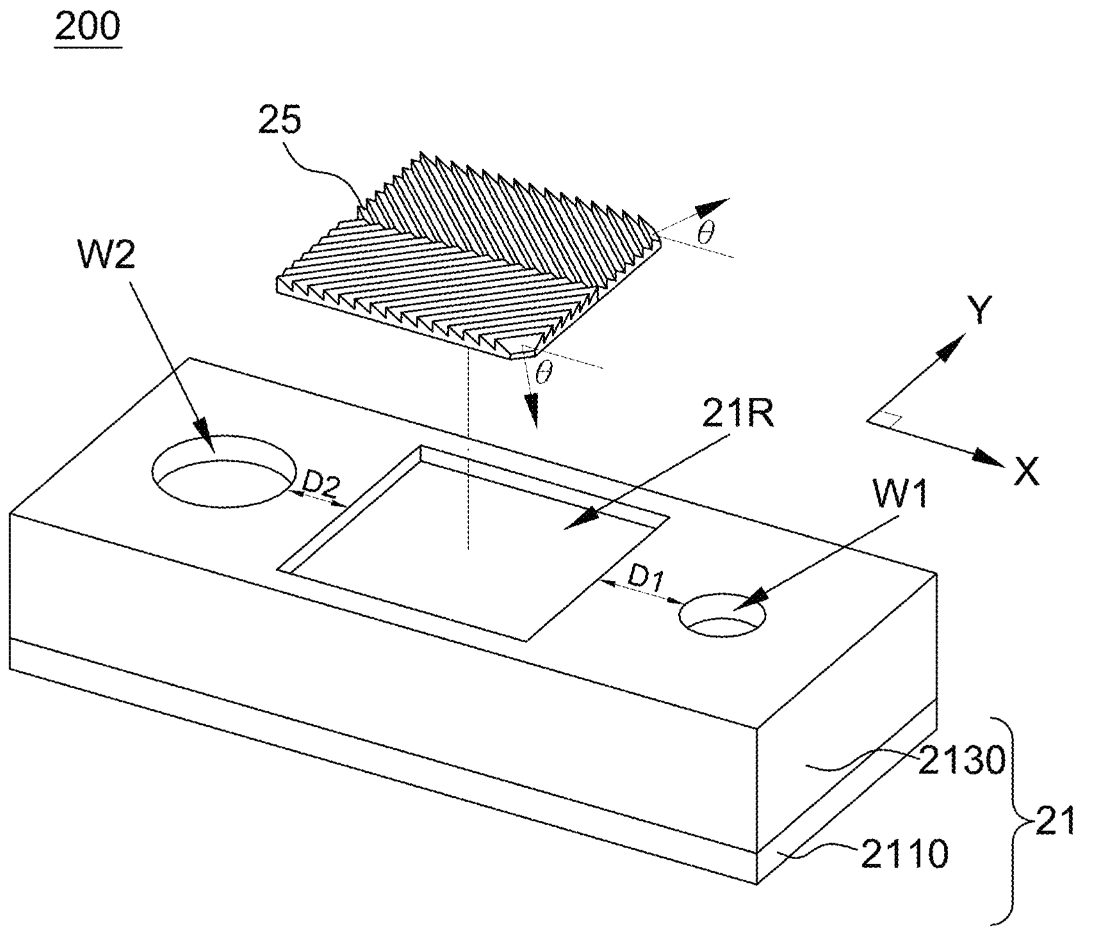
FIG. 2 is a partially exploded view of an image sensor package according to one embodiment of the present disclosure.
Figure 3:
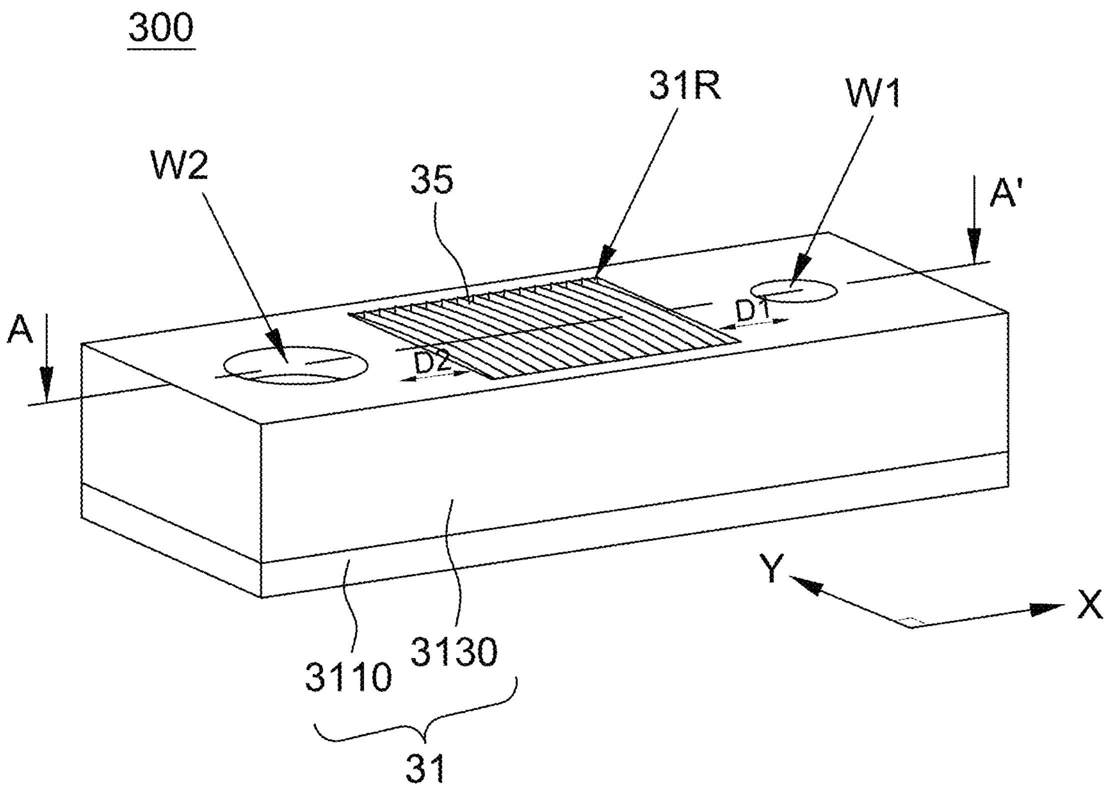
FIG. 3 is a solid diagram of an image sensor package according to one embodiment of the present disclosure.

Please refer to FIG. 2, it is a partially exploded view of an image sensor package 200 according to one embodiment of the present disclosure. The image sensor package 200 includes a package body 21 and a microstructure component 25. The package body 21 includes a substrate 2110 and a cover 2130. The microstructure component 25 is arranged inside a recess 21R at an upper surface of the cover 2130, e.g., referring to FIG. 3. FIG. 3 is a solid diagram of an image sensor package 300 according to an embodiment of the present disclosure, wherein the image sensor package 300 also includes a package body 31 and a microstructure component 35, which has been put in the recess 31R. The difference between the image sensor package 300 and the image sensor package 200 is that the configuration of the microstructure component 35 is different from the microstructure component 25.

Figure 4B:
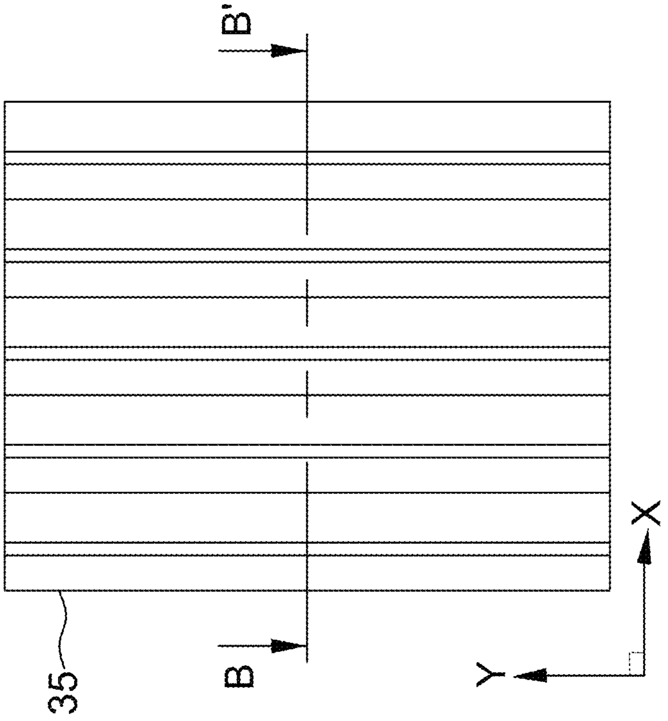
FIG. 4B is another top view of a microstructure component of an image sensor package according to an embodiment of the present disclosure.

In one aspect, the microstructure component 25 includes multiple V-shaped prisms parallel to one another. As shown in FIG. 2, corners (i.e. cross points of two sides of the V-shape) of the multiple V-shape prisms is directed to a direction of a light source (i.e. arranged inside the first opening W1, referring to FIG. 5), e.g., a first direction shown as X-direction in FIG. 2. Two sides of the multiple V-shape prisms respectively have an included angle θ with respect to the first direction, wherein the included angle θ is between 0 degree and 90 degrees. In an aspect that the included angle θ is 0 degree, the configuration shown in FIGS. 3 and 4B is formed. That is, in another aspect, the microstructure component 35 includes multiple elongated prisms arranged to form multiple parallel straight prisms extending in a second direction (e.g., Y-direction shown in FIG. 3) perpendicular to the first direction.

Figure 4A:
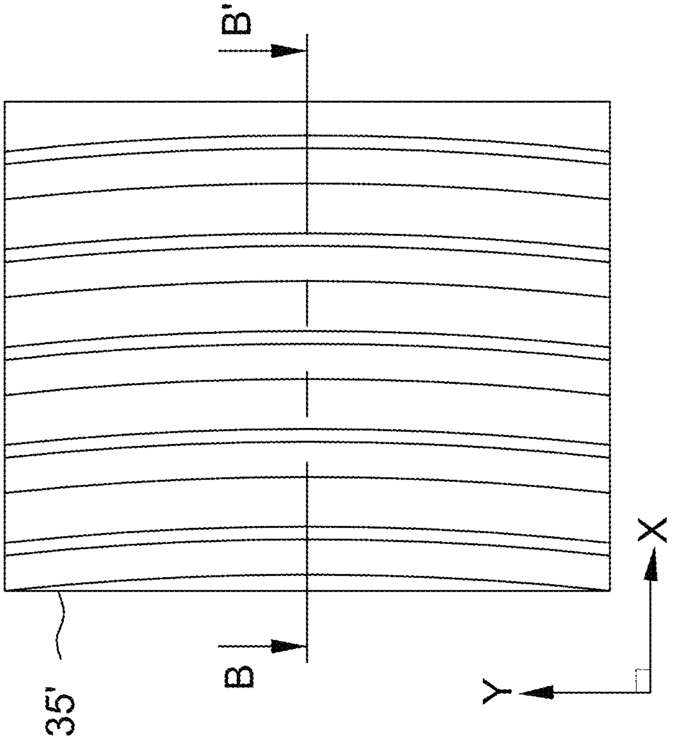
FIG. 4A is a top view of a microstructure component of an image sensor package according to an embodiment of the present disclosure.
Figure 4C:
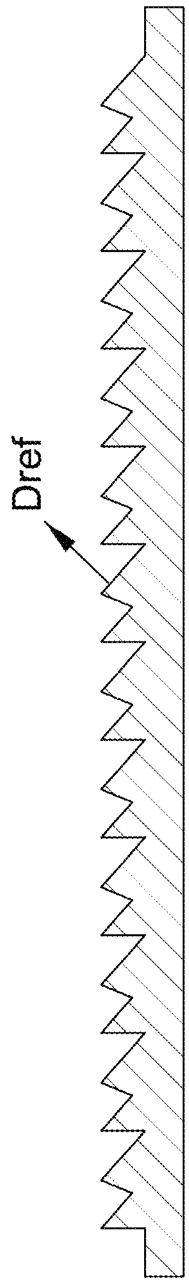
FIG. 4C is a cross sectional view along line B-B' of the microstructure component in FIGS. 4A and 4B.

In another aspect, a microstructure component 35' includes multiple elongated prisms arranged as multiple parallel curved prisms having vertexes (e.g., center points of curved prisms in FIG. 4A) aligned in the first direction, shown as X-direction in FIG. 4A. That is, the vertexes are aligned with a direction toward the light source (i. e. along the first direction). In the multiple elongated prisms, normal directions Dref of reflective surfaces toward a side of the light source are identical to or different from one another, e.g., referring to FIG. 4C. However, said normal directions Dref are all toward directions far from the light sensor so as to reflect stray light to propagate in directions leaving the light sensor.

Figure 9C:
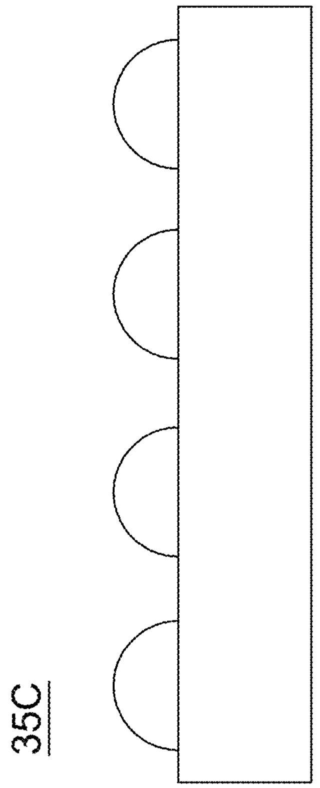
FIGS. 9A to 9D are cross sectional views of the microstructure component according to other embodiments of the present disclosure.
Figure 9D:
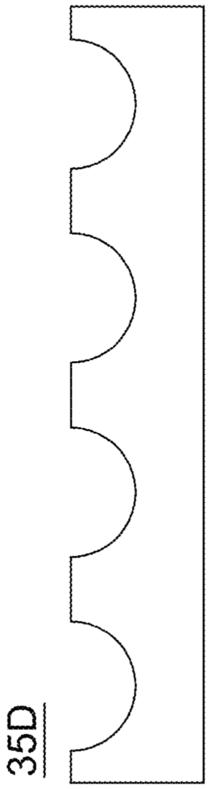
Figure 9A:
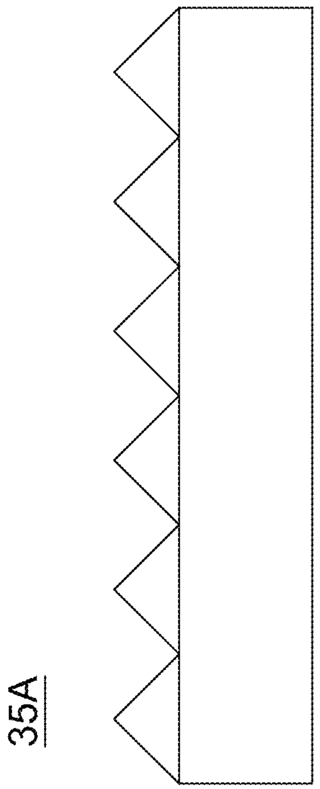
Figure 9B:
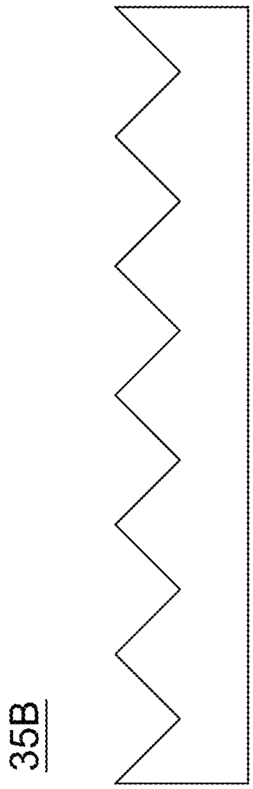

Please refer to FIGS. 9A to 9B, it is an aspect that normal directions Dref of reflective surfaces of the multiple elongated prisms toward a side of the light source are identical to one another. The microstructure component 35A is formed by, for example, attaching a prism thin film (each prism having a triangular cross section) to a rectangular transparent film (having material identical to or different from that of the prism thin film) or formed by injection molding as an integrated structure; and the microstructure component 35B is formed by, for example, injection molding as an integrated structure.

The cross section of the prism is not limited to have a triangular shape. For example refer to FIGS. 9C to 9D, the microstructure component 35C is formed by, for example, attaching a prism thin film (each prism having a semicircular cross section) to a rectangular transparent film (having material identical to or different from that of the prism thin film) or formed by injection molding as an integrated structure; and the microstructure component 35D is formed by, for example, injection molding as an integrated structure. In other aspects, the prisms are not limited to be formed as continuously elongated structure but formed as multiple separated prisms arranged adjacent to each other, e.g., in up-down directions of FIGS. 4A and 4B.

For example, the plane surface (or bottom surface) of the microstructure component 35A-35D is bonded to a surface of the recess 31R by adhesive 350.

Figure 5:
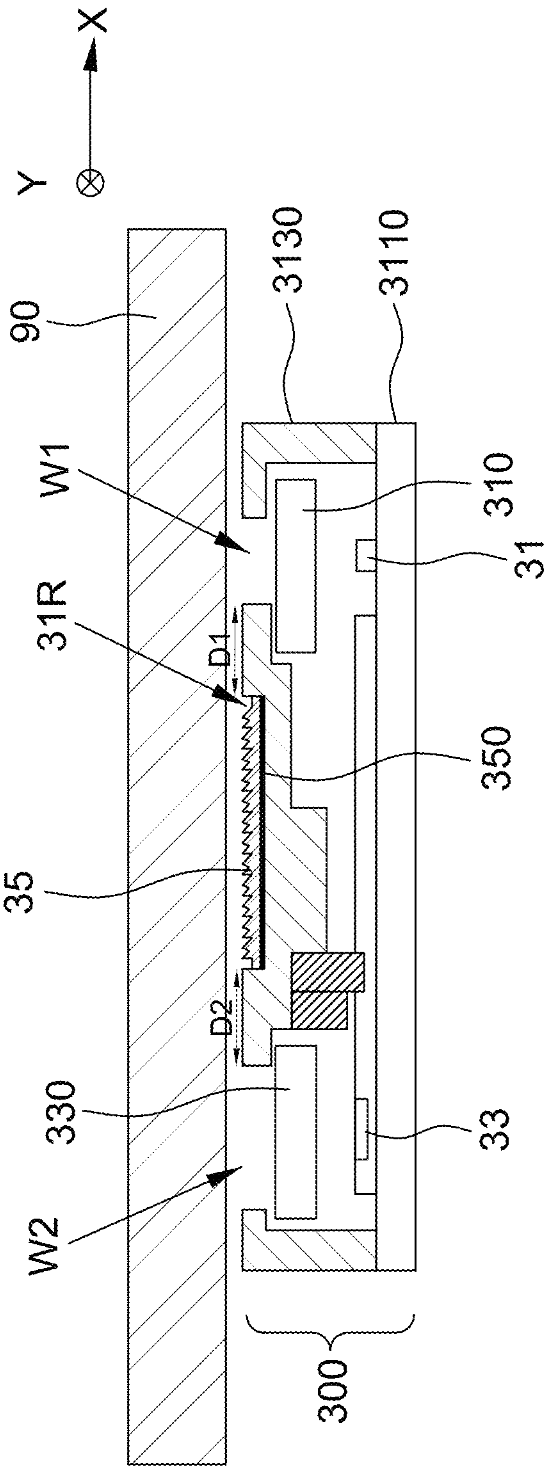
FIG. 5 is a cross sectional view along line A-A' of the image sensor package shown in FIG. 3.

Please refer to FIGS. 3 and 5, FIG. 5 is a cross sectional view along line A-A' of the image sensor package 300 in FIG. 3. A package body 31 includes a substrate 3110, a light source 31, a light sensor 33 and a cover 3130, wherein the light source 31, the light sensor 33 and the cover 3130 are all arranged on the substrate 3110. The cover 3130 of the image sensor package 300 is arranged with a protecting film 90 thereon. Due to the assembly tolerance, the protecting file 90 may not be tightly attached to an upper surface of the cover 3130 and has a space therebetween.

The substrate 3110 is, for example, a printed circuit board or a flexible board without particular limitations.

The light sensor 33 is electrically connected to the substrate 3110. The light sensor 33 is, for example, a complementary metal oxide semiconductor (CMOS) image sensor or a single photon avalanche diode (SPAD) image sensor.

The light source 31 is a coherent light source, a partially coherent light source or a non-coherent light source, e.g., a light emitting diode or a laser diode. The light source 31 is arranged at a side in a first direction (e.g., the right side in FIG. 5) from the light sensor 33.

The cover 31 is made from opaque material, and covers upon the light source 31 and the light sensor 33. The cover 3130 has a first opening W1 and a second opening W2 respectively opposite to the light source 31 and the light sensor 33 to specify an illumination range and a light receiving range. The cover 3130 has a first accommodation space for accommodating the light source 31, and the light source 31 emits light to outside of the image sensor package 300 via the first opening W1 above the first accommodation space. The cover 3130 has a second accommodation space for accommodating the light sensor 33, and the light sensor 33 receives reflected light from outside of the image sensor package 300 via the second opening W2 above the second accommodation space, e.g., reflected light from an object in front of the cover 3130 of the image sensor package 300, wherein the object is a part of a human body, but not limited thereto. The light sensor 33 is embedded in a sensor chip that includes a processor circuit such as an ASIC, DSP or a FPGA.

The cover 3130 further has a recess 31R at an upper surface of the cover 3130, and between the first opening W1 and the second opening W2 in the first direction. In one aspect, the upper surface is a plane surface. More specifically, in addition to having the first opening W1, the second opening W2 and the recess 31R, other parts of the upper surface is a plane surface.

In the aspect of FIGS. 3 and 5, the first opening W1 is separated from the recess 31R in the first direction by a first distance D1, and the second opening W2 is separated from the recess 31R in the first direction by a second distance D2. In one aspect, the first distance D1 and the second distance D2 are determined according to a thickness of a protecting film 90 putting on the upper surface of the cover 3130. When the thickness of the protecting film 90 is larger, a distance of a light beam propagating to have an inner reflection inside the protecting film 90 is longer, and thus the first distance D1 and the second distance D2 are arranged longer. On the contrary, when the thickness of the protecting film 90 is smaller, a distance of a light beam propagating to have an inner reflection inside the protecting film 90 is shorter, and thus the first distance D1 and the second distance D2 are arranged shorter. Said inner reflection is referred to a reflection of a light beam inside the protecting film 90.

In another aspect, the first distance D1 and the second distance D2 are fixed. However, a width of the microstructure component 35 in the first direction is changed corresponding to different thicknesses of the protecting film 90.

In one aspect, a bottom surface of the microstructure component 35 is a plane surface, and the plane surface is bonded to a surface of the recess 31R by adhesive 350. Generally, the microstructure component 35 is formed by black material or light absorption material. By arranging the microstructure component 35 with multiple prisms, the stray light not being absorbed by the microstructure component 35 is reflected to a direction far from the light sensor 33 without entering the second opening W2 and received by the light sensor 33.

The image sensor package 300 further includes filters 310 and 330 respectively arranged at the first opening W1 and the second opening W2. The filters 310 and 330 are used to block light having wavelengths other than the emission wavelength of the light source 31. The filters 310 and 330 are attached or secured to the cover 3130, or arranged inside the first accommodation space and the second accommodation space respectively in front of the light source 31 and the light sensor 33 without particular limitations.

Figure 6:
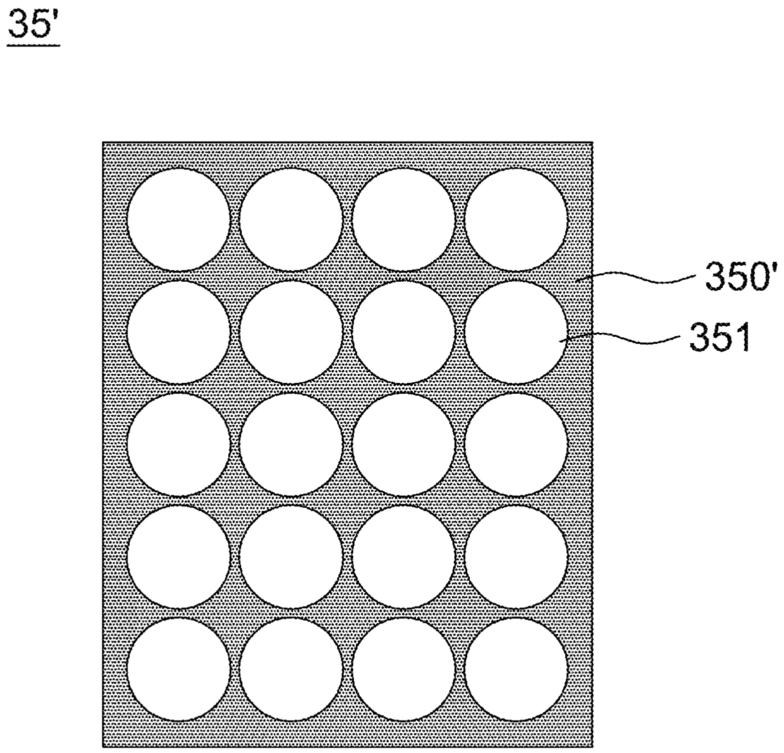
FIG. 6 is a schematic diagram of a glass bead reflector of a microstructure component of an image sensor package according to an embodiment of the present disclosure.

In addition to being formed by multiple elongated prisms, the microstructure component 35 may further be formed by a glass bead reflector or a cube corner reflector to realize the light reflection effect. Please refer to FIG. 6, in the aspect that the microstructure component 35 includes glass beads 351, the microstructure component 35 further includes silver glue laid under the glass beads 351 (or enwrapping lower part of the glass beads 351) to improve the total reflecting ability.

In one aspect, a depth of the recess 31R is larger than or equal to a height of the microstructure component 35 such that the microstructure component 35 is fully arranged inside the recess 31R.

Figure 7:
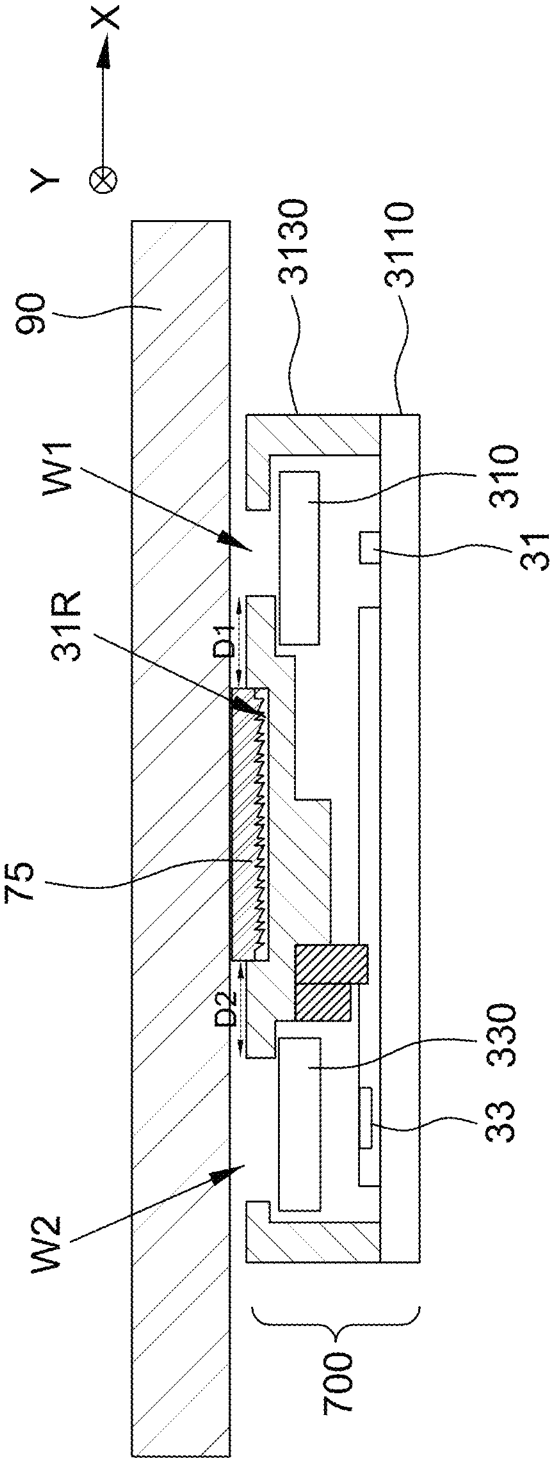
FIG. 7 is a cross sectional view of an image sensor package according to another embodiment of the present disclosure.

Please refer to FIG. 7, it is a cross sectional view of an image sensor package 700 according to another embodiment of the present disclosure, wherein a protecting film 90 is also shown to be put on the image sensor package 700. The package body of the image sensor package 700 also includes a substrate 3110, a light source 31, a light sensor 33, filters 310 and 30, and a cover 3130. In the image sensor package 700, components identical to those in the image sensor package 300 are indicated by the same reference numerals, and thus details thereof are not repeated herein.

The main difference between the image sensor package 700 and the image sensor package 300 is that a bottom surface of a microstructure component 75 is a zig-zag surface and a top surface thereof is a plane surface, which is used to be attached to the protecting film 90 putting on the upper surface of the cover 3130. In this embodiment, the microstructure component 75 preferably has the same material as the protecting film 90, e.g., glass or plastic. In this way, when a top surface of the microstructure component 75 is attached to the protecting film 90, stray light inside the protecting film 90 enters microstructure component 75 and then reflected by the zig-zag surface at the bottom surface of the microstructure component 75 toward a direction far from a position of the light sensor 33.

Similarly, the zig-zag surface is formed by multiple elongated prisms, and the multiple elongated prisms are arranged to form multiple parallel V-shaped prisms, to form multiple parallel straight prisms extending in a second direction (e.g., Y-direction) perpendicular to the first direction (e.g., X-direction), or to form multiple parallel curved prisms having vertexes located along the first direction, e.g., referring to FIGS. 2 to 4B.

In one aspect, the microstructure component 75 is combined to a surface of the recess 31R via adhesive, and a depth of the recess 31R is smaller than a height of the microstructure component 75 such that the microstructure component 75 is protruded out from the recess 31R for being attached to the bottom surface of the protecting film 90. In one aspect, a top surface of the microstructure component 75 is combined to the bottom surface of the protecting film 90 via transparent adhesive.

Figure 8:
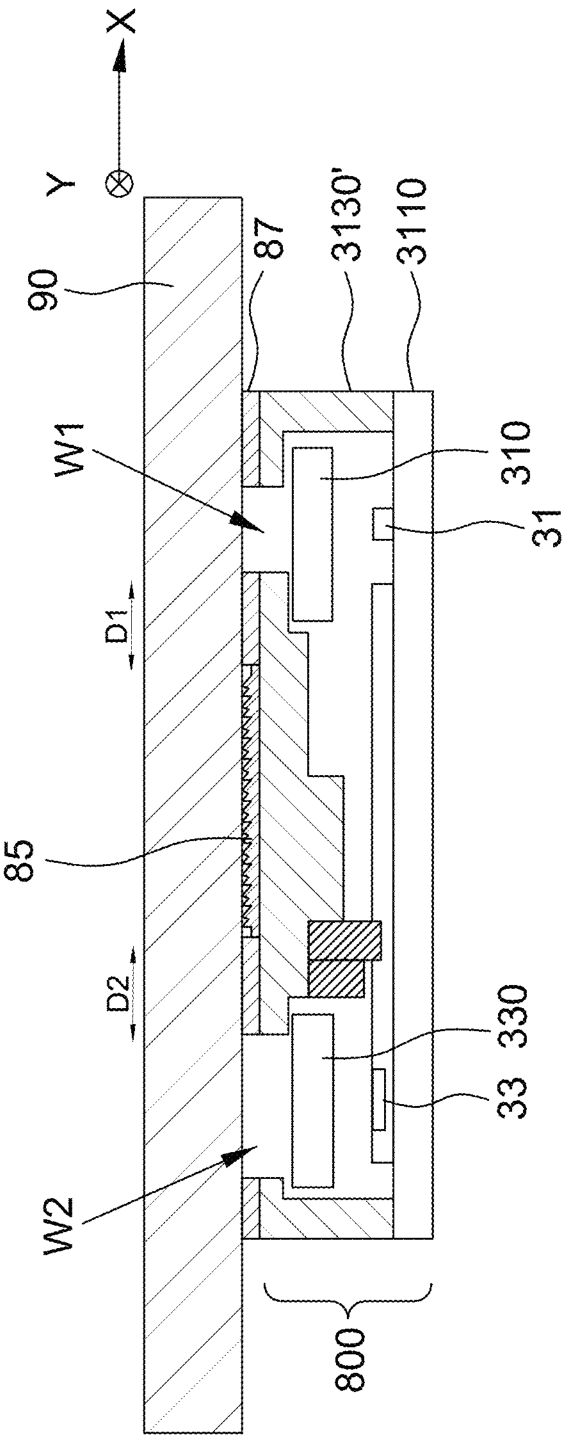
FIG. 8 is a cross sectional view of an image sensor package according to an alternative embodiment of the present disclosure.

Please refer to FIG. 8, it is a cross sectional view of an image sensor package 800 according to an alternative embodiment of the present disclosure, wherein a protecting film 90 is also shown to be put on the image sensor package 800. The package body of the image sensor package 800 also includes a substrate 3110, a light source 31, a light sensor 33, filters 310 and 30, and a cover 3130'. In the image sensor package 800, components identical to those in the image sensor package 300 are indicated by the same reference numerals, and thus details thereof are not repeated herein.

The main difference between the image sensor package 800 and the image sensor package 300 is that the microstructure component 85 is directly attached to a plane upper surface of the cover 3130', and between a first opening W1 and a second opening W2. That is, there is no recess arranged on the cover 3130'. The first opening W1 is separated from a first edge (e.g., a right edge) of the microstructure component 85 in the first direction (e.g., X-direction) by a first distance D1, the second opening W2 is separated from a second edge (e.g., a left edge) of the microstructure component 85 in the first direction by a second distance D2.

Similarly, the first distance D1 and the second distance D2 are determined according to a thickness of the protecting film 90 putting on the plane upper surface of the cover 3130'.

Furthermore, the image sensor package 800 further includes a spacer 87 arranged between the protecting film 90 and the plane upper surface of the cover 3130' to form an accommodation space for accommodating the microstructure component 85. The spacer 87 is formed by, for example, rubber or plastic without particular limitations. The spacer 87 is arranged on the whole or a part of the plane upper surface of the cover 3130' according to different applications.

In one aspect of FIG. 8, a bottom surface of the microstructure component 85 is a zig-zag surface and a top surface thereof is a plane surface, similar to FIG. 7. Similarly, said zig-zag surface is formed by multiple elongated prisms, and the multiple elongated prisms are arranged to form multiple parallel V-shaped prisms, to form multiple parallel straight prisms extending in a second direction (e.g., Y-direction) perpendicular to the first direction (e.g., X-direction), or to form multiple parallel curved prisms having vertexes located along the first direction, e.g., referring to FIGS. 2 to 4B.

In another aspect of FIG. 8, a bottom surface of the microstructure component 85 is a plane surface, and a top surface thereof is a zig-zag surface, similar to FIG. 5. In this aspect, in addition to being formed by multiple elongated prisms, referring to FIG. 4C, said microstructure component 85 is formed by a glass bead reflector or a cube corner reflector.

In the present disclosure, the protecting film 90 is formed by glass or plastic according to different applications.

In the present disclosure, the direction far from the light sensor 33 includes a range from a direction toward the light source 31 (i.e. the first direction) to a second direction perpendicular to the first direction, e.g., a range of 180 degrees.

It should be mentioned that although the drawings of the present disclosure show that the recess and the microstructure component both having rectangular shapes, the present disclosure is not limited thereto. In other aspects, the recess and the microstructure component have a circular shape, an oval shape, a trapezoid shape or other shapes without particular limitations. In addition, the microstructure component may have a different shape from the recess as long as the microstructure component is able to be inserted inside the recess.

As mentioned above, in conventional image sensor packages, although the reflected light energy can be reduced by arranging a soft rubber thereon, the deformation of the soft rubber may be generated at the opening to block the light propagating path. Accordingly, the present disclosure further provides an image sensor package (e.g., FIGS. 5, 7 and 8) in which a microstructure component is further arranged on an upper surface of a cover thereof to redirect stray light coming from a protecting film to a direction far from a position of a light sensor to reduce stray light noises and improve the image quality.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

The invention claimed is:

1. An image sensor package, comprising:
- a substrate;
- a light sensor, arranged on the substrate;
- a light source, arranged on the substrate and located at a side of the light sensor in a first direction;
- a cover, arranged on the substrate and covering the light sensor and the light source, wherein the cover comprises a first opening opposite to the light source, a second opening opposite to the light sensor, and a recess located at an upper surface of the cover and between the first opening and the second opening; and
- a microstructure component, arranged inside the recess.

2. The image sensor package as claimed in claim 1, wherein
- the first opening is separated from the recess in the first direction by a first distance,
- the second opening is separated from the recess in the first direction by a second distance, and
- the first distance and the second distance are determined according to a thickness of a protecting film configured to be put on the upper surface of the cover.

3. The image sensor package as claimed in claim 2, wherein an area of the upper surface respectively within the first distance and the second distance is a plane surface.

4. The image sensor package as claimed in claim 1, wherein the microstructure component comprises multiple elongated prisms, and the multiple elongated prisms are arranged to form multiple parallel V-shaped prisms, to form multiple parallel straight prisms extending in a second direction perpendicular to the first direction, or to form multiple parallel curved prisms having vertexes located along the first direction.

5. The image sensor package as claimed in claim 1, wherein a bottom surface of the microstructure component is a plane surface, and the plane surface is bonded to a surface of the recess via adhesive.

6. The image sensor package as claimed in claim 1, wherein the microstructure component comprises a glass bead reflector or a cube corner reflector.

7. The image sensor package as claimed in claim 1, wherein a depth of the recess is larger than or equal to a height of the microstructure component.

8. An image sensor package, comprising:
- a substrate;
- a light sensor, arranged on the substrate;
- a light source, arranged on the substrate and located at a side of the light sensor in a first direction;
- a cover, arranged on the substrate and covering the light sensor and the light source, wherein the cover comprises a first opening opposite to the light source, a second opening opposite to the light sensor, and a recess located at an upper surface of the cover and between the first opening and the second opening; and
- a microstructure component, arranged inside the recess, wherein a bottom surface of the microstructure component is a zig-zag surface and a top surface of the microstructure component is a plane surface, which is configured to be attached to a protecting film putting on the upper surface of the cover.

9. The image sensor package as claimed in claim 8, wherein
- the first opening is separated from the recess in the first direction by a first distance,
- the second opening is separated from the recess in the first direction by a second distance, and
- the first distance and the second distance are determined according to a thickness of the protecting film.

10. The image sensor package as claimed in claim 9, wherein an area of the upper surface respectively within the first distance and the second distance is a plane surface.

11. The image sensor package as claimed in claim 8, wherein the zig-zag surface is formed by multiple elongated prisms, and the multiple elongated prisms are arranged to form multiple parallel V-shaped prisms, to form multiple parallel straight prisms extending in a second direction perpendicular to the first direction, or to form multiple parallel curved prisms having vertexes located along the first direction.

12. The image sensor package as claimed in claim 8, wherein the microstructure component is bonded to a surface of the recess via adhesive, and a depth of the recess is smaller than a height of the microstructure component.

13. An image sensor package, comprising:

a substrate;

a light sensor, arranged on the substrate;

a light source, arranged on the substrate and located at a side of the light sensor in a first direction;

a cover, arranged on the substrate and covering the light sensor and the light source, wherein the cover comprises a first opening opposite to the light source, a second opening opposite to the light sensor, and a plane upper surface; and a microstructure component, attached to the plane upper surface, and between the first opening and the second opening.

14. The image sensor package as claimed in claim 13, wherein the first opening is separated from a first edge of the microstructure component in the first direction by a first distance, the second opening is separated from a second edge of the microstructure component in the first direction by a second distance, and the first distance and the second distance are determined according to a thickness of a protecting film configured to be put on the plane upper surface of the cover.

15. The image sensor package as claimed in claim 14, further comprising a spacer arranged between the protecting film and the plane upper surface to form an accommodation space for accommodating the microstructure component.

16. The image sensor package as claimed in claim 13, wherein the microstructure component comprises multiple elongated prisms, and the multiple elongated prisms are arranged to form multiple parallel V-shaped prisms, to form multiple parallel straight prisms extending in a second direction perpendicular to the first direction, or to form multiple parallel curved prisms having vertexes located along the first direction.

17. The image sensor package as claimed in claim 13, wherein the microstructure component comprises a glass bead reflector or a cube corner reflector.

18. The image sensor package as claimed in claim 13, wherein a bottom surface of the microstructure component is a zig-zag surface and a top surface of the microstructure component is a plane surface.

19. The image sensor package as claimed in claim 13, wherein a bottom surface of the microstructure component is a plane surface and a top surface of the microstructure component is a zig-zag surface.

* * * * *